United States Patent
Wichowski et al.

(10) Patent No.: US 9,742,326 B2
(45) Date of Patent: Aug. 22, 2017

(54) FIELD PROGRAMMABLE GATE ARRAY BASED BRUSHLESS DC MOTOR SPEED DETECTOR

(71) Applicant: Hamilton Sundstrand Space Systems International, Inc., Windsor Locks, CT (US)

(72) Inventors: Robert P. Wichowski, Westfield, CT (US); Kevin G. Hawes, Windsor Locks, CT (US)

(73) Assignee: Hamilton Sundstrand Space Systems International, Inc., Charlotte, NC (US)

( * ) Notice: Subject to any disclaimer, the term of this patent is extended or adjusted under 35 U.S.C. 154(b) by 229 days.

(21) Appl. No.: 14/338,210

(22) Filed: Jul. 22, 2014

(65) Prior Publication Data

US 2016/0028338 A1  Jan. 28, 2016

(51) Int. Cl.
| | | |
|---|---|---|
| G05B 5/01 | (2006.01) | |
| H02P 6/16 | (2016.01) | |
| G01D 5/14 | (2006.01) | |
| G01R 23/02 | (2006.01) | |
| H02P 6/17 | (2016.01) | |

(52) U.S. Cl.
CPC ........... H02P 6/165 (2013.01); G01D 5/145 (2013.01); G01R 23/02 (2013.01); H02P 6/17 (2016.02)

(58) Field of Classification Search
CPC ............................... H02P 2203/09; G01P 3/00
USPC ......................................................... 318/618
See application file for complete search history.

(56) References Cited

U.S. PATENT DOCUMENTS

| | | | | |
|---|---|---|---|---|
| 5,265,037 | A | 11/1993 | Izumi et al. | |
| 5,663,618 | A | 9/1997 | Adachi et al. | |
| 6,778,938 | B1* | 8/2004 | Ng | G01P 3/481 318/463 |
| 8,294,396 | B2* | 10/2012 | Wichowski | H02P 6/165 318/254.1 |
| 2006/0250104 | A1* | 11/2006 | Reichert | G02B 26/122 318/651 |
| 2012/0293097 | A1* | 11/2012 | Tachibana | H02P 6/06 318/400.06 |
| 2013/0229140 | A1* | 9/2013 | Busch | G06F 1/206 318/811 |

FOREIGN PATENT DOCUMENTS

| | | |
|---|---|---|
| DE | 3519716 | 12/1986 |
| EP | 2276166 | 1/2011 |

OTHER PUBLICATIONS

Extended European Search Report dated Oct. 22, 2015 in European Application No. 15177537.6.

* cited by examiner

Primary Examiner — Bickey Dhakal
(74) Attorney, Agent, or Firm — Snell & Wilmer L.L.P.

(57) ABSTRACT

A counter is started on the falling edge of a tach pulse. This counter counts to the rising edge of a second tach pulse, such as the next tach pulse. During the duration of the tach pulse the FPGA calculates the RPM of a motor. In this way, during each commutation period, a RPM is calculated. The present system performs a RPM calculation during each commutation period and/or tach pulse duration.

12 Claims, 5 Drawing Sheets

FIELD PROGRAMMABLE GATE ARRAY BASED BRUSHLESS DC MOTOR SPEED DETECTOR

FIELD

The present disclosure relates to speed detection and more specifically, to a process and system configured for speed detection of revolutions of poles of a motor.

BACKGROUND

The subject matter disclosed herein generally relates to a brushless direct current (DC) motor that can use sensors and switches to electrically control commutation. One or more sensors can be used to determine position or speed information for feedback control of the brushless DC motor. When sensors are used that provide timing information, commutation control may be non-linear with respect to the rotational speed of the motor. Non-linear period information complicates control logic, which can require the use of demanding mathematical calculations and complex algorithms for accurate control. Such control logic typically utilizes a microprocessor and accompanying computer system control elements, such as non-volatile memory, volatile memory, arbitration logic, operating system software, and application software in the motor control loop. The use of a microprocessor and computer system control elements may be unsuitable for certain environments that are geometrically constrained and/or subject to harsh environmental conditions, for instance, high radiation environments.

SUMMARY

According to various embodiments, a method of converting analysis of commutation pulses to a rotational speed of the DC brushless motor may include initiating a counter to begin counting on the falling edge of a first tachometer (or "tach") pulse. The method may include terminating the counting of the counter based on the sensing of a rising edge of a second tach pulse. The method may include calculating the duration between the falling edge of the first tach pulse and the rising edge of the second tach pulse to form a delta duration. The method may include adding a tach pulse duration to the delta duration to determine a commutation period during the second tech pulse. The method may include converting the commutation pulses into the rotational speed of the DC brushless motor to provide a linear feedback control parameter.

According to various embodiments, a FPGA-based digital motor controller is configured to initiate a counter to begin counting on the falling edge of a first tach pulse. The FPGA-based digital motor controller may be configured to terminate the counting of the counter based on the sensing of a rising edge of a second tach pulse. The duration between the falling edge of the first tach pulse and the rising edge of the second tach pulse forms a delta duration. The FPGA-based digital motor controller may be configured to add a tach pulse duration to the delta duration to determine a commutation period during the second tech pulse. A FPGA-based digital motor controller may be configured to convert the commutation period to a speed of a motor.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step.

Speed feedback generation may be utilized to support linear digital compensation for brushless DC motors. Historically, Hall Effect sensors are used to provide position feedback to the FPGA. The information is time based and needs to be converted into frequency information. The rate the information is generated is based on the speed (revolutions per minute or "RPM") and number of poles of the motor. At low speeds, less information is generated. The sample rate of the speed needs to be maximized during low speed and high torque applications. The present disclosure describes a system and method to increase the speed of the sampling rate. Due to the increased sampling rate data is accumulated more quickly than conventional processes. The data may be transmitted to motor controller and increase the efficiency of a motor controller.

Figure 1:
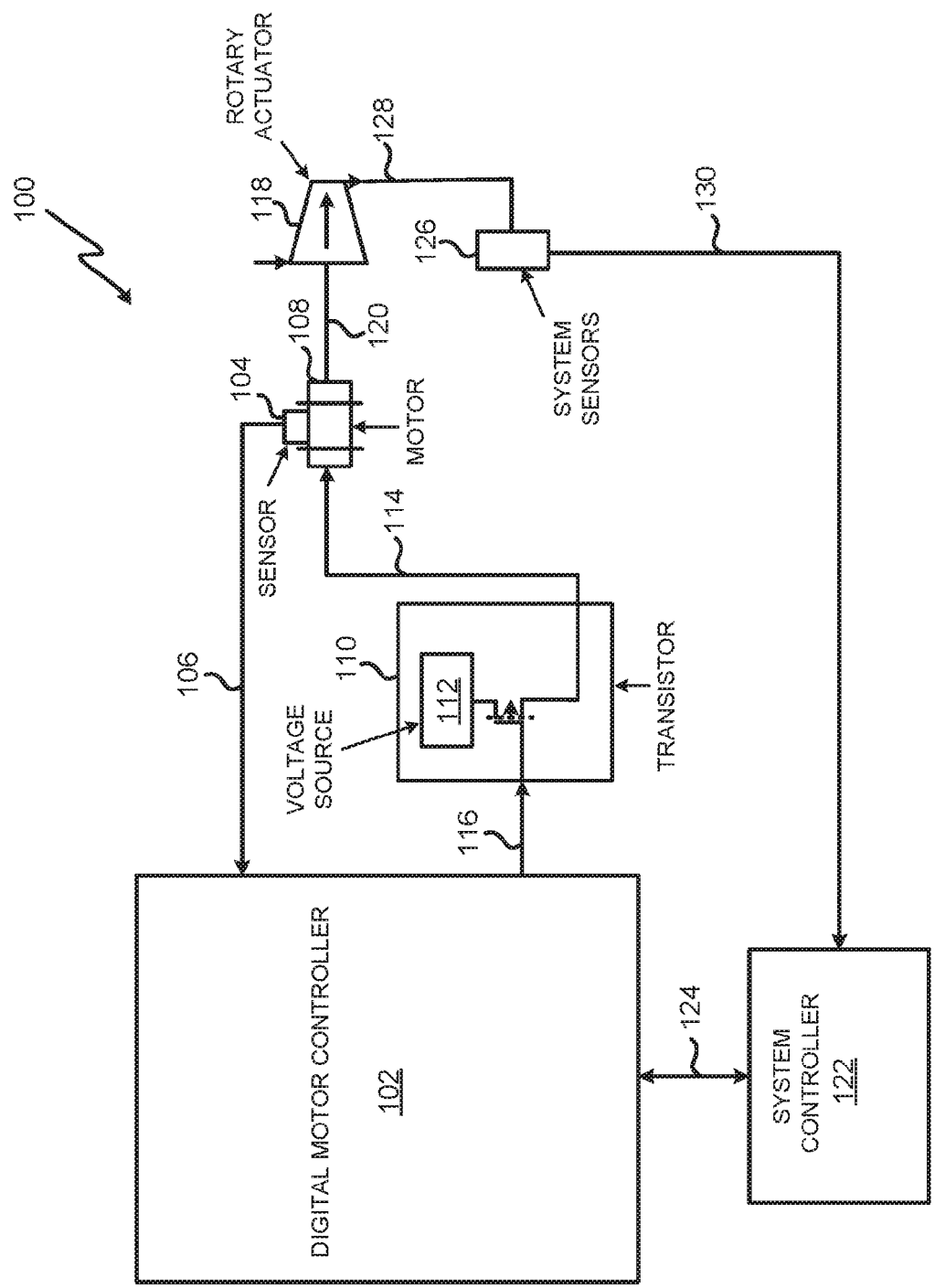
FIG. 1 depicts a block diagram of an exemplary embodiment of a system comprising a FPGA-based digital motor controller in accordance with various embodiments.

FIG. 1 illustrates a block diagram of an exemplary embodiment of a system 100 with a FPGA-based digital motor controller 102. FPGA-based digital motor controller 102 may be a compact FPGA-based digital motor controller 102. The FPGA-based digital motor controller 102 receives input data from one or more sensors 104 via sensor data link 106. The one or more sensors 104 may be Hall Effect sensors that detect magnetic field changes due to rotation of a direct current (DC) brushless motor 108. In various embodiments, the one or more sensors 104 produce timing pulses responsive to a rotational position of the DC brushless motor 108. Motor drive transistors 110 switch a drive voltage source 112 onto motor drive link 114, providing switched current to establish commutation for the DC brushless motor 108. Switch commands are driven from the FPGA-based digital motor controller 102 to the motor drive transistors 110 using switch command link 116. Mechanical rotation of the DC brushless motor 108 can drive a rotary actuator 118 coupled through mechanical linkage 120. The mechanical linkage 120 may include gearing and other components (not depicted)

The FPGA-based digital motor controller 102 may receive commands from a system controller 122 through a communication link 124. The system controller 122 can monitor the rotary actuator 118 using system sensors 126. An actuator feedback link 128 provides a feedback path between the rotary actuator 118 and the system sensors 126. A system sensor data link 130 can be used to pass data from the system sensors 126 to the system controller 122. In the embodiment depicted in FIG. 1, the t FPGA-based digital motor controller 102 performs closed-loop feedback control of the DC brushless motor 108, while the system controller 122 provides closed-loop feedback control of the rotary actuator 118.

In an exemplary embodiment, the system controller 122 provides control and configuration commands to the FPGA-based digital motor controller 102 and may also read status data from the FPGA-based digital motor controller 102. The system controller 122 can communicate with multiple instances of the FPGA-based digital motor controller 102 to command multiple instances of the DC brushless motor 108 and the rotary actuator 118 as part of a larger control system.

Although the FPGA-based digital motor controller 102 is depicted as a single block, it will be understood that the functionality implemented within the FPGA-based digital motor controller 102 can be distributed over multiple FPGAs. FPGAs may comprise semiconductor devices that can be configured after manufacturing according to hardware description language (HDL) files. HDL files may be implemented in a variety of formats, such as very high-speed integrated circuit hardware description language (VHDL) and/or Verilog files, including point dividers programmed in Verilog. As used herein, the term "FPGA" can refer to any programmable logic device capable of performing closed-loop digital motor control absent software execution.

Figure 2:
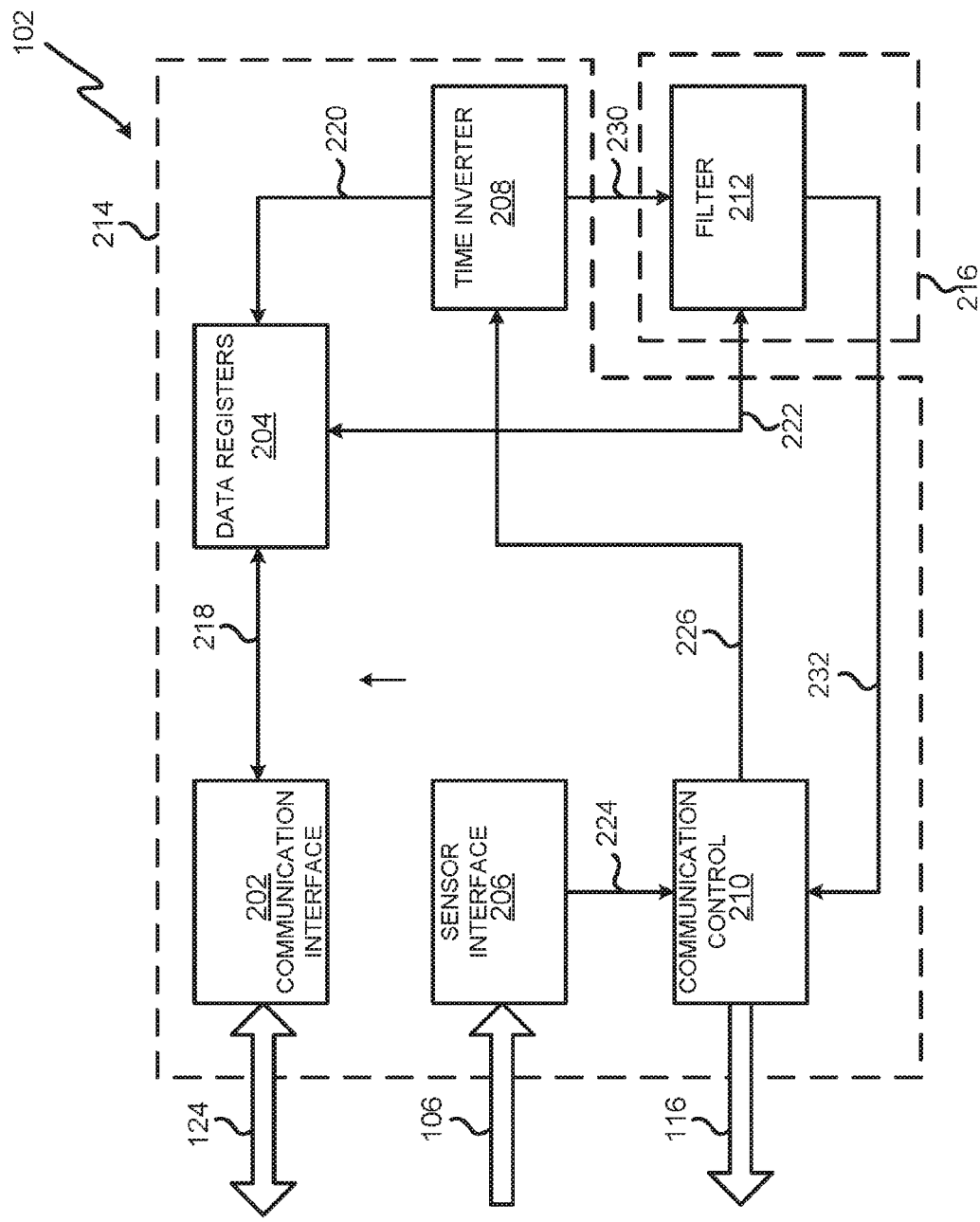
FIG. 2 depicts a block diagram of a FPGA-based digital motor controller in accordance with various embodiments.

FIG. 2 depicts further details of an embodiment of the FPGA-based digital motor controller 102. As illustrated in FIG. 2, the FPGA-based digital motor controller 102 includes hardware circuitry for a communication interface 202; data registers 204, sensor interface 206, time inverter 208, commutation control 210, and linear digital compensation filter 212. The communication interface 202, data registers 204, sensor interface 206, time inverter 208, commutation control 210, and linear digital compensation filter 212 can be implemented in a single FPGA device or distributed between multiple FPGA devices. In one embodiment, the communication interface 202, data registers 204, sensor interface 206, time inverter 208, and commutation control 210 are grouped in a first FPGA 214, while the linear digital compensation filter 212 is included in a second FPGA 216. This configuration may enable a common implementation of the first FPGA 214 and customized implementations of multiple instances of the second FPGA 216 to support multiple configurations of the DC brushless motor 108 and the rotary actuator 118 of FIG. 1 as part of a larger control system.

Both the first compact FPGA 214 and the second compact FPGA 216 can be implemented using antifuse (one-time programmable) technology to decrease susceptibility to radiation, such as alpha particles, which can cause circuits to malfunction. Thus, implementing the FPGA-based digital motor controller 102 in antifuse technology may increase overall reliability of the system 100 of FIG. 1, particularly in high-radiation environments. The physical area of the first FPGA 214 and the second FPGA 216 may be about 1 inch-square (2.54 centimeters-square), where the first FPGA 214 and the second FPGA 216 contain about 100,000 gates each. It will be understood that the physical dimensions and number of gates for the first FPGA 214 and the second FPGA 216 can vary within the scope of the disclosure.

The communication interface 202 is coupled to the communication link 124 to provide bidirectional communication with the system controller 122 of FIG. 1. The communication interface 202 may support a variety of communication protocols and standards known in the art, such as RS-485 to support point-to-point and multi-drop bus communication. Data path 218 provides a bidirectional communication link between the communication interface 202 and the data registers 204. The communication interface 202 can perform communication protocol conversion, enabling the system controller 122 of FIG. 1 to read and write values in the data registers 204. The data registers 204 may store a variety of configuration parameters, commands, and status information. For example, the data registers 204 can interface with the time inverter 208 and linear digital compensation filter 212 via data path 220 and data path 222 respectively.

The sensor interface 206 receives sensor data from the sensor data link 106 and can provide conditioned sensor data to the commutation control 210 using data path 224. The sensor data received at the sensor interface 206 from the one or more sensors 104 of FIG. 1 may be formatted as digital position data. For example, each of the one or more sensors 104 can generate a pulse as a rotor of the DC brushless motor 108 of FIG. 1 rotates in close physical proximity to a given sensor of the one or more sensors 104. The sensor interface 206 can use edge detection logic to trigger one or more timers to start, stop, and/or capture time values as transitional edges are detected. Timers may be included in the sensor interface 206 and/or in the commutation control 210.

The commutation control 210 can convert values received from the sensor interface 206 into commutation pulse data. The commutation pulse data may be formatted as time values indicating elapsed time between a common position and/or multiple positions relative to the DC brushless motor 108 of FIG. 1. The commutation pulse data is sent to the time inverter 208 via data path 226.

In various embodiments, the time inverter 208 performs a mathematical inversion of time values from the commutation pulse data and outputs a rotational speed in revolutions-per-minute (RPM). The time inverter 208 may be implemented exclusively in hardware circuitry and performs the mathematical inversion of time values (1/time) without software assistance to provide a linear feedback control parameter for controlling the DC brushless motor 108 of FIG. 1. The time inverter 208 may include scalable parameters to control the accuracy of the calculations. In an exemplary embodiments, the accuracy of the time inverter 208 is scalable between 24 and 48 bits. The time inverter 208 may also support additional accuracy ranges. Converting non-linear commutation pulse data to RPM provides linearization to simplify closed loop control logic. Further or alternate scaling, such as unit conversion, may be performed prior to passing resulting data values to the data registers 204 on data path 220 and to the linear digital compensation filter 212 on data path 230. Speed data passed to the data registers 204 can be read by the system controller 122 of FIG. 1 using the communication interface 202. Speed data passed to the linear digital compensation filter 212 supplies a linear feedback control parameter to determine an error value for controlling the DC brushless motor 108 of FIG. 1.

The linear digital compensation filter 212 provides compensation logic for stable control of the DC brushless motor 108 of FIG. 1. The linear digital compensation filter 212 may include one or more digital filter stages, such as an infinite impulse response (IIR) filter or a finite impulse response (FIR) filter. The linear digital compensation filter 212 may also include control loop logic for implementing any combination of proportional, integral, and/or differential control. A commanded speed value can be received from the data registers 204, in addition to one or more gain values and filter coefficients. The values from the time inverter 208 provide control loop feedback for linear digital control. This avoids complexity that may be associated with more advanced control loop designs, such as non-linear state space control. The linear digital compensation filter 212 drives an output on data path 232 that attempts to reduce an error value between a commanded value and the actual value determined by the time inverter 208. In an exemplary embodiments, the output on data path 232 is a compensation command for the commutation control 210, which may be in a pulse-width-modulation (PWM) command.

The commutation control 210 converts compensation commands from the linear digital compensation filter 212 into switching commands to output on the switch command link 116. The commutation control 210 may issue commands as PWM cycles with an adjustable duty cycle and/or frequency. In an various embodiments, the commutation control 210 implements predictive control to avoid noise induced errors. The predictive control can include filtering self-generated noise. The commutation control 210 may use conditioned sensor data generated by the sensor interface 206 to determine when an error condition likely exists. For example, the commutation control 210 can determine that the rate of change between position data is too fast, indicating that false pulses may be present. The commutation control 210 can maintain a switching sequence from a previous switching cycle or issue no switching commands until the error condition is removed.

It will be understood that data paths 220-232 may be combined into any combination of shared data path. Sharing data paths can reduce the amount of resources dedicated to routing data paths within the FPGA-based digital motor controller 102.

Figure 3:
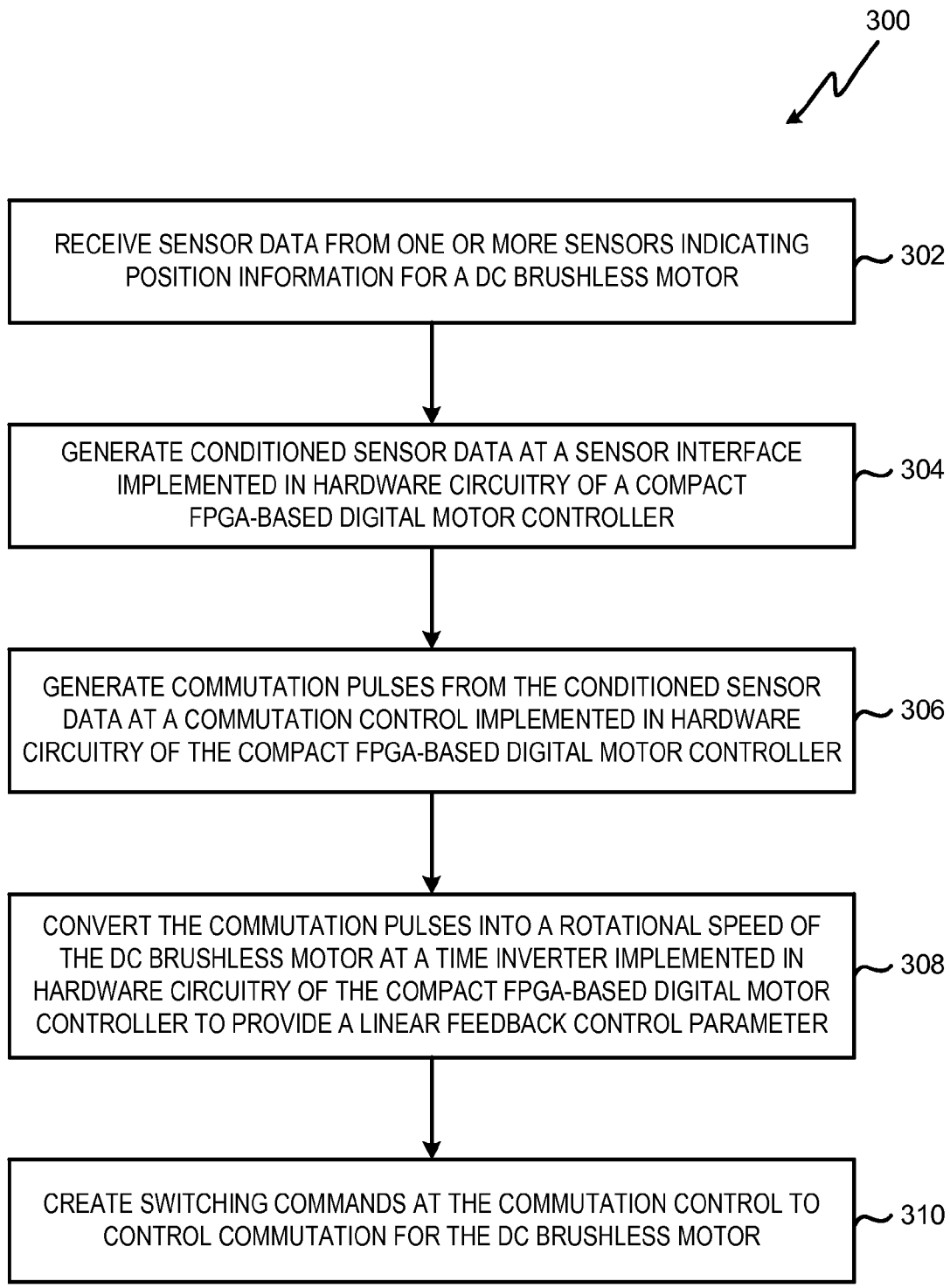
FIG. 3 depicts a process for providing a FPGA-based digital motor controller data in accordance with various embodiments.

FIG. 3 depicts a process 300 for providing a FPGA-based digital motor controller, such as the FPGA-based digital motor controller 102 of FIGS. 1 and 2. At block 302, the sensor interface 206 receives sensor data from one or more sensors 104 indicating position information for DC brushless motor 108. At block 304, the sensor interface 206 generates conditioned sensor data. At block 306, commutation control 210 generates commutation pulses from the conditioned sensor data. At block 308, time inverter 208 converts the commutation pulses into a rotational speed of the DC brushless motor 108 to provide a linear feedback control parameter. At block 310, commutation control 210 creates switching commands to control commutation for the DC brushless motor 108. Data registers 204 can be used to store command and status information, with communication interface 202 providing communication between the data registers 204 and system controller 122 of FIG. 1. Linear digital compensation filter 212 may receive the rotational speed from the time inverter 208 and a speed command from the data registers 204, outputting a compensation command to the commutation control 210 responsive to the rotational speed and the speed command. As previously described, the commutation control 210 can include additional functionality, such as performing predictive control to filter self-generated noise.

Figure 4:
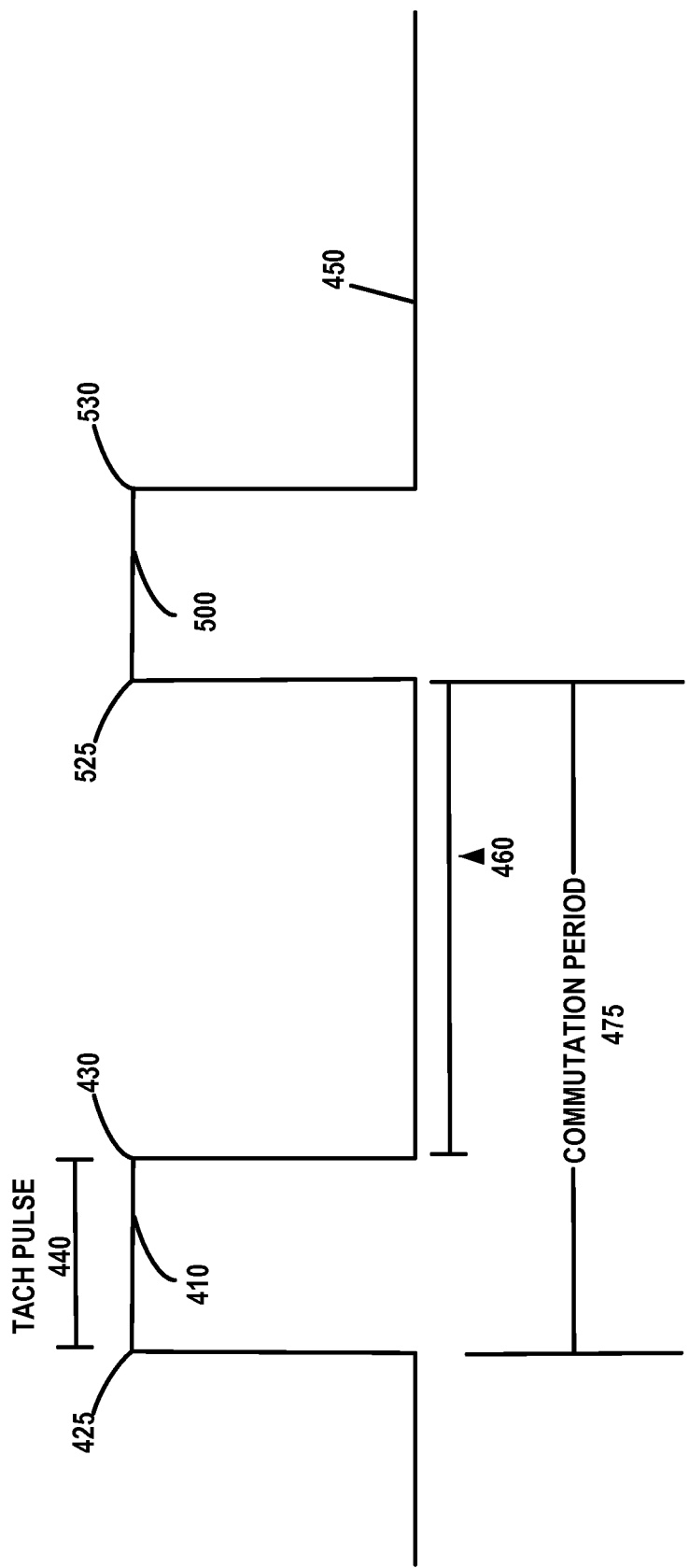
FIG. 4 depicts a representative waveform of a signal for analysis in accordance with various embodiments.

According to various embodiments and with reference to FIG. 4, a waveform 450 for a signal appears as a pulse train with a period inversely proportional to speed. As noted above, a FPGA-based digital motor controller component may be used for speed determination and/or generation. For instance, a tachometer signal generated during commutation of the motor phase may provide the timing position information of the rotor. Minimizing calculation errors is desirable in providing accurate information to the speed calculation VHDL fixed point divider. For instance, one count can be greater than 50 RPM based on a counter period. Therefore, simultaneously using the rising edge 425 of the pulse train to determine commutation period data and initializing the counter for a second tach pulse 500, such as the next tach pulse, may introduce speed calculation errors, and therefore not recommended.

Linear speed-based control using a gate array may be partially dependent on the number of poles in the motor, as the number of poles in the motor affects the commutation pulses per revolution of the motor. For instance, a four pole motor has a low commutation pulse per revolution value, such as 12 tach pulses and/or 12 commutation changes per revolution.

With renewed reference to FIG. 4, the commutation period 475 is the duration and/or distance from the rising edge 425 of the tach pulse 410, to the rising edge 525 of the next, and/or a second tech pulse 500. A counter may be started on the falling edge 430 of the tach pulse 410. This counter may count to the rising edge 525 of a second tach pulse 500. In concert with the generation of the tach pulse 410 (during the duration 440 of the tach pulse 410), the FPGA may calculate the RPM as noted above. In this way, during each commutation period 475, a RPM may be calculated. In contrast to legacy systems where a RPM calculation may have been performed every other tach pulse, the present system may perform a RPM calculation during each commutation period 475/tach pulse duration 440. RPM calculation performed every other tach pulse may lead to unstable motor control.

In this way, since each tach pulse time duration 440 is known, it may be utilized by the system to an advantage. The answer from the counter may be added to the known tach pulse time duration 440 to achieve the delta 460 and/or difference of the commutation period 475 less the tach pulse duration 440. In this way, each tach pulse/commutation period 475 a RPM calculation may be performed and speed data may be generated. The calculation of the delta 460 of the commutation period 475 less the tach pulse duration 440 may be determined at time where the counter is not counting. Stated another way, the calculation of the delta 460 of the commutation period 475 less the tach pulse duration 440 may be determined while the counter is idle. The falling edge 430 of a first tach pulse 410 and rising edge 525 of the next second tach pulse 500 may be utilized to determine the commutation period.

Figure 5:
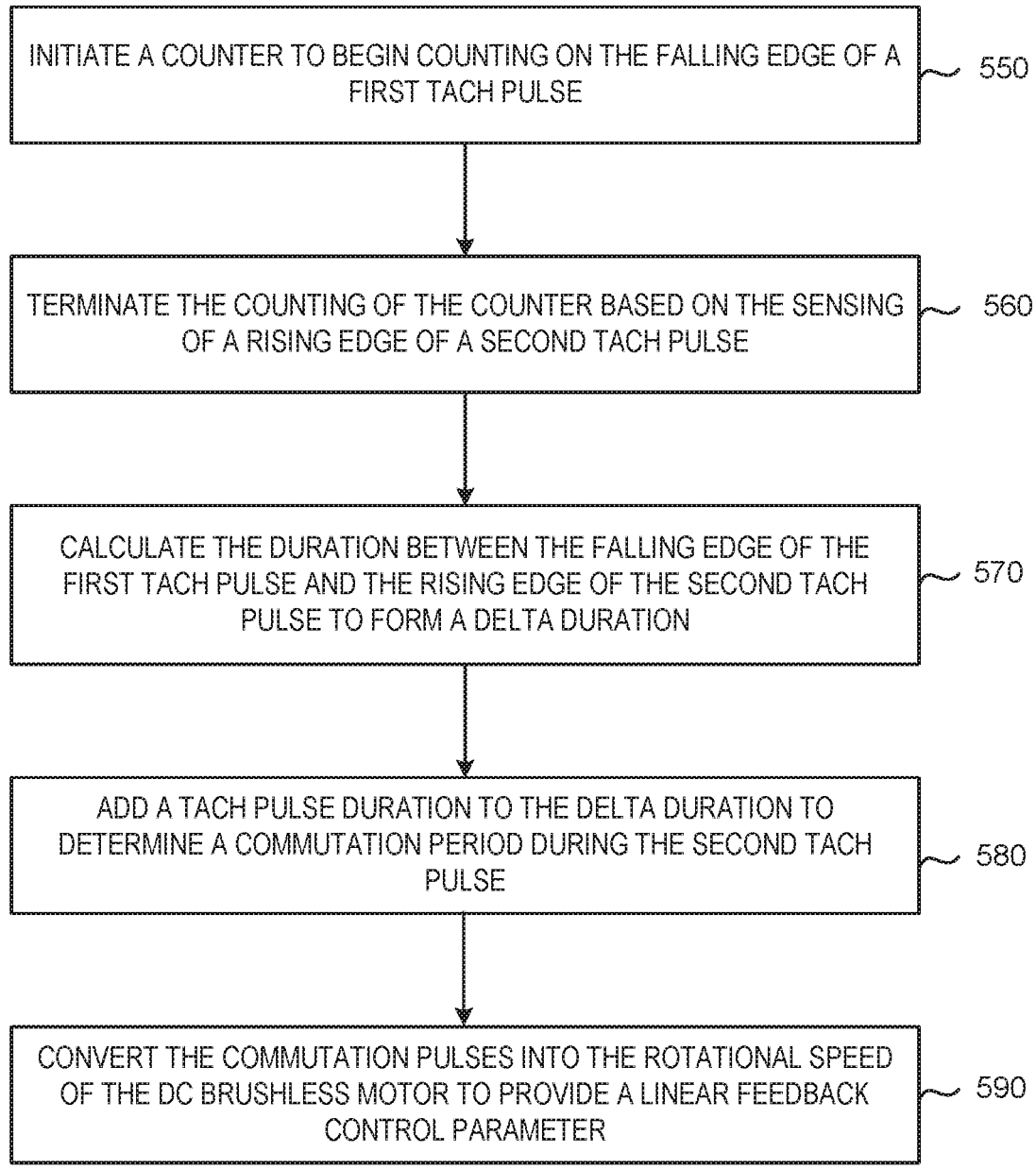
FIG. 5 depicts a process flow of a method of determining and/or detecting speed of a motor in accordance with various embodiments.

According to various embodiments and with reference to FIG. 5, a method of converting analysis of commutation pulses to a rotational speed of the DC brushless motor may include initiating a counter to begin counting on the falling edge of a first tach pulse (Step 550). The method may include terminating the counting of the counter based on the sensing of a rising edge of a second tach pulse (Step 560). The method may include calculating the duration between the falling edge of the first tach pulse and the rising edge of the second tach pulse to form a delta duration (Step 570). The method may include adding a tach pulse duration to the delta duration to determine a commutation period during the second tech pulse (Step 580). The method may include converting the commutation pulses into the rotational speed of the DC brushless motor to provide a linear feedback control parameter (Step 590)

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Different cross-hatching is used throughout the figures to denote different parts but not necessarily to denote the same or different materials.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of determining a rotational speed of a DC brushless motor comprising:

initiating, by a field programmable gate array-based (FPGA-based) digital motor controller, a counter to begin counting on a falling edge of a first tach pulse;

terminating, by the FPGA-based digital motor controller, the counting of the counter based on a sensing of a rising edge of a second tach pulse, wherein a duration between the falling edge of the first tach pulse and the rising edge of the second tach pulse forms a delta duration;

adding, by the FPGA-based digital motor controller, a tach pulse duration to the delta duration to determine a commutation period during the second tach pulse, the tach pulse duration comprising a duration between a rising edge of the first tach pulse and the falling edge of the first tach pulse; and converting the commutation period into the rotational speed of the DC brushless motor to provide a linear feedback control parameter;

wherein the first tach pulse and the second tach pulse are generated in response to a rotation of a rotor of the DC brushless motor, and the FPGA-based digital motor controller comprises;

a communication interface, coupled with a plurality of data registers, configured to perform communication protocol conversion, enabling a system controller to read and write command and status information in the plurality of data registers;

a sensor interface receiving sensor data from one or more sensors indicating position information for the DC brushless motor;

a commutation control, coupled with the sensor interface, configured to convert the sensor data into a commutation pulse data and generates the first tach pulse and the second tach pulse; and a time inverter, coupled with the plurality of data registers, configured to convert the commutation period into the rotational speed of the DC brushless motor by using the first tach pulse and the second tach pulse.

2. The method of claim 1, wherein the adding is performed via at least one of a VHDL fixed point divider or a Verilog point divider.

3. The method of claim 1, further comprising performing a motor speed calculation during each commutation period.

4. The method of claim 1, further comprising performing a RPM calculation during each tach pulse.

5. The method of claim 1, wherein the tach pulse duration is known a priori.

6. The method of claim 1, wherein the commutation period is a duration from the rising edge of the first tach pulse to the rising edge of the second tach pulse.

7. The method of claim 1, wherein the commutation period is determined while the counter is idle.

8. A system comprising:

a digital motor controller configured to:

initiate a counter to begin counting on a falling edge of a first tach pulse; terminate the counting of the counter based on a sensing of a rising edge of a second tach pulse, wherein a duration between the falling edge of the first tach pulse and the rising edge of the second tach pulse forms a delta duration;

add a tach pulse duration to the delta duration to determine a commutation period during the second tach pulse, the tach pulse duration comprising a duration between a rising edge of the first tach pulse and the falling edge of the first tach pulse; and convert the commutation period to a rotational speed of a DC brushless motor, wherein the digital motor controller comprises:
- a communication interface, coupled with a data register, configured to perform communication protocol conversion, enabling a system controller to read and write command and status information in the data register;
- a sensor interface receiving sensor data from one or more sensors indicating position information for the DC brushless motor;
- a commutation control, coupled with the sensor interface, configured to convert the sensor data into a commutation pulse data and generates the first tach pulse and the second tach pulse; and
- a time inverter, coupled with the data register, configured to convert the commutation period into the rotational speed of the DC brushless motor by using the first tach pulse and the second tach pulse, and the digital motor controller is a field programmable gate array.

9. The system of claim 8, wherein the digital motor controller is further configured to convert the first tach pulse and the second tach pulse into the rotational speed of the DC brushless motor to provide a linear feedback control parameter.

10. The system of claim 8, wherein the digital motor controller is further configured to perform a motor speed calculation during each commutation period of the motor.

11. The system of claim 8, wherein the digital motor controller is further configured measure a duration from a rising edge of the first tach pulse to the rising edge of the second tach pulse.

12. The system of claim 8, further comprising a linear digital compensation filter interfacing with at least one of the time inverter and the data register.

* * * * *